(12) United States Patent
Freier et al.

(10) Patent No.: US 8,743,462 B2
(45) Date of Patent: Jun. 3, 2014

(54) CONCENTRATING DAYLIGHT COLLECTOR

(75) Inventors: David G. Freier, Saint Paul, MN (US);
Thomas R. Corrigan, Saint Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 13/811,673

(22) PCT Filed: Aug. 9, 2011

(86) PCT No.: PCT/US2011/046998
§ 371 (c)(1),
(2), (4) Date: Jan. 23, 2013

(87) PCT Pub. No.: WO2012/021471
PCT Pub. Date: Feb. 16, 2012

(65) Prior Publication Data
US 2013/0120844 A1    May 16, 2013

Related U.S. Application Data

(60) Provisional application No. 61/373,357, filed on Aug. 13, 2010.

(51) Int. Cl.
*G02B 27/00*    (2006.01)

(52) U.S. Cl.
USPC .......................................................... 359/596

(58) Field of Classification Search
USPC .................................. 359/592–593, 596–597
See application file for complete search history.

(56) References Cited

U.S. PATENT DOCUMENTS

| 1,254,520 | A | * | 1/1918 | Macduff | 359/597 |
| 4,561,423 | A | | 12/1985 | Blasey | |
| 4,890,900 | A | | 1/1990 | Walsh | |
| 5,285,315 | A | | 2/1994 | Stiles | |
| 5,493,824 | A | | 2/1996 | Webster | |
| 6,128,135 | A | | 10/2000 | Stiles | |
| 6,299,317 | B1 | * | 10/2001 | Gorthala | 359/593 |
| 7,339,739 | B1 | | 3/2008 | Kinney | |
| 7,639,423 | B2 | | 12/2009 | Kinney | |
| 2002/0179138 | A1 | | 12/2002 | Lawheed | |
| 2004/0231715 | A1 | | 11/2004 | Pagel | |
| 2007/0035841 | A1 | | 2/2007 | Kinney | |
| 2008/0266664 | A1 | * | 10/2008 | Winston et al. | 359/592 |
| 2009/0032103 | A1 | | 2/2009 | Yi | |
| 2010/0091396 | A1 | | 4/2010 | Hutson | |
| 2011/0272002 | A1 | | 11/2011 | Liu | |
| 2012/0091897 | A1 | * | 4/2012 | O et al. | 359/597 |
| 2012/0126098 | A1 | | 5/2012 | Bartenbach | |

FOREIGN PATENT DOCUMENTS

| EP | 869229 | | 10/1998 | |
| KR | 1994-7003070 | * | 9/1994 | F24J 2/52 |
| KR | 2009-0105899 | | 10/2009 | |
| WO | WO 84-00068 | | 1/1984 | |
| WO | WO 2009-000070 | | 12/2008 | |

* cited by examiner

*Primary Examiner* — Christopher Mahoney
(74) *Attorney, Agent, or Firm* — Robert V. Heiti

(57) ABSTRACT

The disclosure generally relates to concentrating daylight collectors, and in particular to concentrating daylight collectors useful for interior lighting of a building. The concentrating daylight collectors generally include a plurality of moveable reflective vanes and a Cassegrain-type concentrator section.

20 Claims, 7 Drawing Sheets

US 8,743,462 B2

CONCENTRATING DAYLIGHT COLLECTOR

BACKGROUND

The long-distance transport of visible light through a building can use large mirror-lined ducts, or smaller solid fibers which exploit total internal reflection. Mirror-lined ducts include advantages of large cross-sectional area and large numerical aperture (enabling larger fluxes with less concentration), a robust and clear propagation medium (i.e., air) that leads to both lower attenuation and longer lifetimes, and a potentially lower weight per unit of light flux transported. Solid fibers include the advantage of configuration flexibility, which can result in relatively tight bends with low light loss. While the advantages of mirror-lined ducts may appear overwhelming, fibers are nevertheless frequently selected because of the practical value of assembling light conduits in much the same fashion as plumbing. Regardless of the technique used to transport light effectively, a practical and efficient daylight collector that can also concentrate the collected light is needed.

SUMMARY

The disclosure generally relates to concentrating daylight collectors and in particular to concentrating daylight collectors useful for interior lighting of a building. The concentrating daylight collectors generally include a plurality of moveable reflective vanes and a cassegrain-type concentrator section. In one aspect, a concentrating daylight collector includes a collection section having a first opening for receiving sunlight and an opposing second opening for transmission of sunlight. The concentrating daylight collector further includes a plurality of moveable reflective vanes disposed adjacent the first opening for directing received sunlight to the opposing second opening. The concentrating daylight collector further includes a parabolic reflector disposed to reflect a major portion of the sunlight passing though the opposing second opening to a hyperbolic reflector disposed adjacent a focal point of the parabolic reflector; and an output aperture disposed to accept sunlight reflected from the hyperbolic reflector.

In another aspect, a concentrating daylight collector includes a sunlight collection section configured to receive a first sunlight beam through an input region and direct a reflected second sunlight beam toward a first output region, the reflected second sunlight beam substantially parallel to a central axis of the sunlight collection section. The concentrating daylight collector further includes a sunlight concentration section disposed adjacent the first output region and configured to receive the reflected second sunlight beam, reflect from a first concentrator surface, and reflect from a second concentrator surface, thereby forming a concentrated sunlight beam directed to an output aperture that is smaller than the first output region.

The above summary is not intended to describe each disclosed embodiment or every implementation of the present disclosure. The figures and the detailed description below more particularly exemplify illustrative embodiments.

BRIEF DESCRIPTION OF THE DRAWINGS

Throughout the specification reference is made to the appended drawings, where like reference numerals designate like elements, and wherein.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1A:
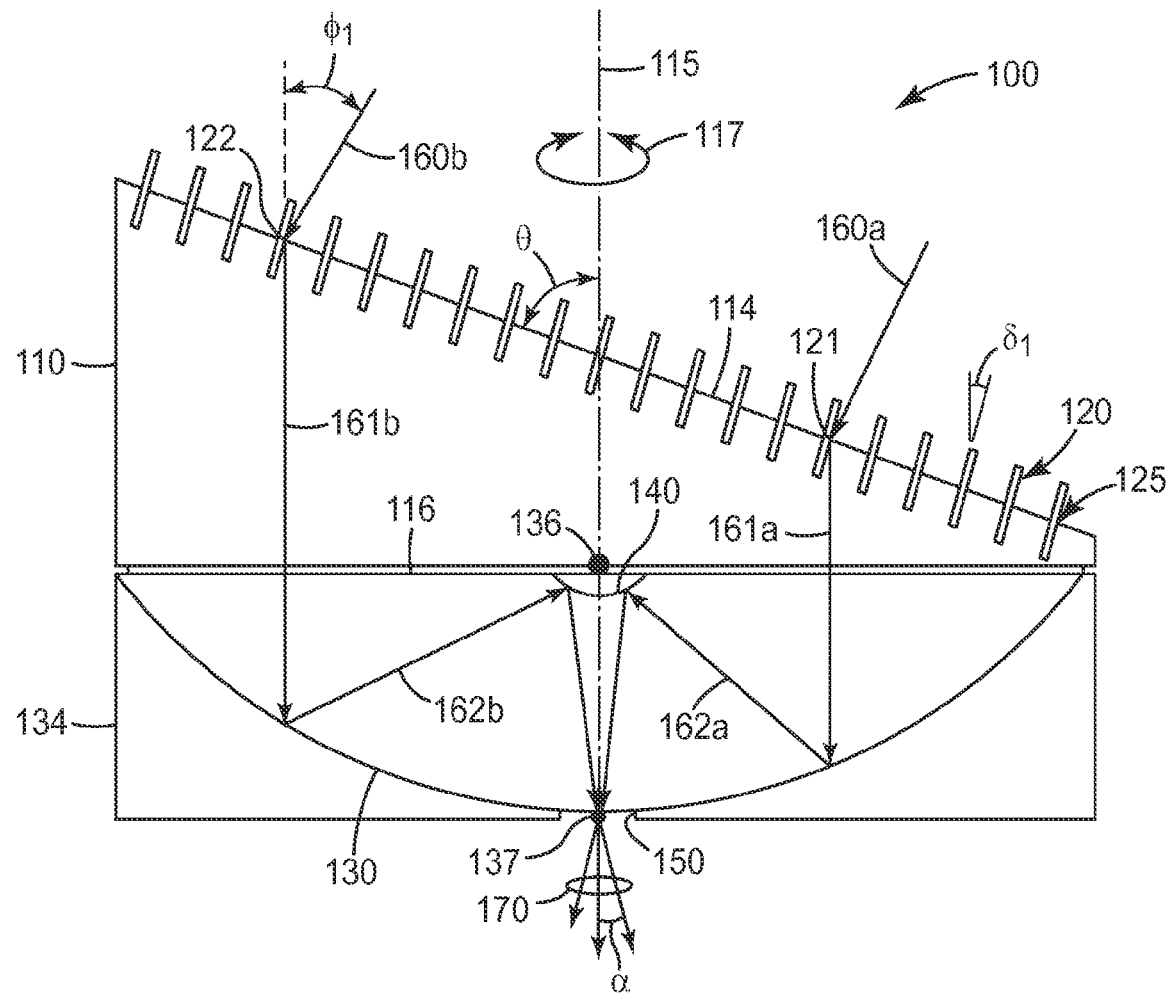
FIG. 1A shows a cross-section schematic of a concentrating daylight collector.

The present disclosure generally relates to concentrating daylight collectors that can be used for illuminating interior spaces of a building with sunlight. Generally, the concentrating daylight collectors direct sunlight into a mirror-lined duct that can be used to distribute the sunlight throughout the building to a point of extraction of the light through a light distribution mirror-lined duct. In some cases, the disclosed concentrating daylight collectors can instead be used more conventionally, such as for directing sunlight onto a photovoltaic cell for generation of electrical power, or an absorbing surface for extraction of thermal energy.

The collector can harvest more flux per unit area of its footprint than most alternatives. It can deliver this flux with a higher concentration than any known alternative (enabling small light-distribution ducts), and with a degree of collimation which is well suited for hollow light-guiding systems with side-wall extraction. In some cases, the concentrating daylight collectors can be positioned either on a roof or on the sun-facing sides of a building. Generally, rooftop placement of a concentrating daylight collector can more readily provide for an unobstructed view of the sun throughout the daylight hours; however, in some cases, mounting on the side of the building may be preferable.

The collector can be robust, with its optical components isolated from the elements, and with a small wind load.

The concentrating daylight collector can be a solar collector/concentrator that tracks the sun's position throughout the day. The concentrating daylight collector harvests highly-collimated solar flux from a large area and deposits it with controlled (and necessarily diminished) collimation within a much smaller area. The concentrating daylight concentrator can comprise two sections that cooperate to concentrate and direct the sunlight. A first section can be described as a collection section, and a second section can be described as a concentration section.

In one particular embodiment, the collection section can include long rows of parallel mirror sections that can be mounted in a frame. The frame can be adapted to rotate about a first axis that, for a rooftop orientation, is generally directed toward the zenith. In some cases, the frame can be adapted to rotate about a first axis that, for a sidewall orientation, is generally directed toward the horizontal. Each of the long rows of mirrors rotates together along a second axis running through each of the mirrors. The entire collection of mirrors can then be rotated about the first axis that is generally orthogonal to the second axis. The resulting collection system is simple to design, build and control, and is capable of gathering more light per unit area than other currently available designs.

Many daylight concentration schemes rely on having the daylight come from a known direction. The present collection section including the mirror array can instead function to track the sun and re-direct the light by reflection in a constant direction. The light can then be concentrated by other optical elements in the concentration section and directed into, for example, a mirror-lined duct system for distribution throughout the building.

In one particular embodiment, a series of nominally rectangular mirrors can be mounted in a frame that can be positioned in a rotating housing, such as within a rotating cylinder. The mirrors can be made to rotate within the frame by a series of pivots. The rotary motion (within that frame) can be constrained to a single degree of freedom (single rotary input), by a variety of techniques known to those of skill in the art, including, for example: a rigid coupling arm positioned across the top of the mirrors with a very simple cylindrical joint (such as a pin in a hole), or a series of small timing pulleys and belts near the ends of the individual mirror pivots.

The rotating housing can provide the second degree of freedom required to align the mirrors relative to the sun. The rotation of the housing can be done, for example, using a chain and sprocket, or by use of a simple wheel pushing on the housing. In some cases, a fairly low resolution encoder tape can be wrapped around the outside diameter of the housing if the housing has a tendency to slip relative to the drive system (i.e. a simple wheel drive).

In one particular embodiment, the concentration section can include a Cassegrain-telescope type concentrator, known to those of skill in the art. Such a concentrator typically includes a combination of a parabolic mirror and a hyperbolic mirror. Generally, the focus of the parabolic mirror and one of the focal points of the hyperbolic mirror are placed such that they approximate a common focal point. The second focal point of the hyperbolic mirror can be positioned adjacent a hole place in the parabolic mirror along the axis of the parabola. In this manner, light rays that enter parallel to the parabolic axis are reflected from the parabolic mirror, directed toward the common focal point, and reflected again from the hyperbolic mirror. The light rays can then exit the concentrator through a hole placed in the parabolic mirror.

The position of the sun can be plotted throughout the day on the winter solstice, the vernal and autumnal equinoxes, and the summer solstice, at desired latitudes, such as, for example, a 30, 45, or 60-degrees latitude. A vast majority of the world's large cities occur between 30 and 60-degrees north latitude. These plotted positions can represent both the extremes (solstices) and mean (equinoxes) in the daytime solar position throughout the year. For latitudes between 23 and 67 degrees, the following apply: 1) the sun always rises and sets south of east or west between the autumnal and vernal equinoxes, north of east and west between the vernal and autumnal equinoxes, and exactly in the east or west on the vernal and autumnal equinoxes; 2) the length of the day increases monotonically between the winter and summer solstices, and 3) the maximum solar elevation occurs midday, and is equal to (90°-latitude+23°) on the summer solstice, (90°-latitude) on the equinoxes, and (90°-latitude−23°) on the winter solstice.

The probability density of the angle between the direction to the sun and due south at each of 30, 45, and 60-degrees latitude can then be plotted. These densities pertain to daytime hours averaged over all of the days of the year. Each density generally exhibits a minimum angular separation equal to 90°-latitude−23° which occurs at noon on the winter solstice. Each also exhibits a cusp at 90°-latitude+23° due to reversal of the sun's migration on the summer solstice, and each extends beyond 90 degrees with probability approximately 0.2 reflecting a northward component in the sun's direction near sunrise and sunset between the vernal and autumnal equinoxes. The probability density of the angle between the direction to the sun and the zenith exhibit a minimum angular separation equal to 90-(90°-latitude+23°) which occurs at noon on the summer solstice, a cusp at 90°-(90°-latitude−23°) due to reversal of the sun's migration on the winter solstice, and do not extend beyond 90 degrees since the sun is above the horizon throughout the day.

The solar flux incident upon a mirror array flush-mounted on the south-facing side of a building is directly proportional to the cosine of the angle of the sun relative to due south. The annual daytime average of this cosine varies between 0.31 at 30-degrees latitude to 0.47 at 60-degrees latitude. The flux incident upon an array flush-mounted on the rooftop is proportional to the cosine of the angle relative to the zenith. The annual daytime average of this cosine varies between 0.35 at 60-degrees latitude to 0.54 at 30-degrees latitude. A collector which is not continuously tilted so as to reduce the angular separation between its surface normal and the direction to the sun suffers an approximate 50-to-70 percent detriment in collectable illuminance because of variability in the sun's position.

The solar flux incident upon the tilted mirror array is directly proportional to the cosine of the angle of the sun relative to outward normal to the array, as known to one of skill in the art. The annual daytime average of this cosine for a south-side mounted collector with a 20-degree tilted array (i.e., tilted 20 degrees from the vertical, or 70 degrees from the horizontal) varies between 0.53 at 30-degrees latitude to 0.63 at 60-degrees latitude. The annual daytime average of this cosine for a rooftop mounted collector with a 20-degree tilted array (i.e., tilted 20 degrees from the horizontal, or 70 degrees from the vertical) varies between 0.63 at 60-degrees latitude to 0.76 at 30-degrees latitude.

The rotation of the array (which is required for a venetian-blind array regardless of its tilt) can reduce the angular separation between the normal to the array and the direction to the sun. Generally, the performance of the tilted rotating array is intermediate between that of a collector with a stationary collection area (e.g., the unfilled array) and that of a fully-tracking collector which maintains the collection area always normal to the direction to the sun. The performance of the tilted array will continue to improve for tilts larger than 20 degrees, such as 30 degrees, 40 degrees or more; however, generally a tilt to no greater than about 20 degrees can avoid an unwieldy depth of the scooped cylinder shape.

Many users of daylighting systems may prefer to not experience fluctuations in system output with intermittent cloud cover during the day, and may also prefer to avoid the need for a separate illumination system for cloudy days and nighttime. To the extent that users may prefer daylight over traditional forms of artificial light, they are likely to also prefer augmenting artificial light which is essentially indistinguishable from daylight. A solar-quality light source having an emission spectrum that has similar collimation can be introduced to the light-distribution duct adjacent to the solar flux. A programmable light-control system can be used, that adjusts the output of the source to compensate for sensed changes in the solar flux in a manner selected by the user. A suitable light source can possess the critical attributes of a spectral emission similar to that of the sun (indicated by both a high color rendering index and a color temperature near 5800° K), and a small physical extent, enabling the creation of uniform collimated flux over, for example, a 6-inch by 6-inch area. In one particular embodiment, an RF-pumped plasma sources possess both of these attributes, as well as the additional desirable attribute of a high luminous efficiency.

FIG. 1A shows a cross-section schematic of a concentrating daylight collector 100 according to one aspect of the disclosure. The concentrating daylight collector 100 can be positioned on a rooftop, or a sun-facing side of a building, as described elsewhere. Concentrating daylight collector 100 includes a collection section 110 and a concentration section 134, each disposed around a common axis 115. In some cases, the collection section 110 can include a cylindrical-shaped housing, a rectangular-shaped housing, or any suitable-shaped housing that can be positioned and rotated as described below. In some cases, the collection section 110 can have a fixed position, and a support structure (not shown) can be made to rotate beneath it.

The collection section 110 includes a first opening 114 for receiving sunlight and a second opening 116 for transmission of sunlight through to the concentration section 134. The first opening 114 can be positioned at a tilt angle θ to a common axis 115 of the collection section 110. In some cases, the tilt angle θ can range from about 0 to about 90 degrees, or from about 20 to about 70 degrees, or from about 60 to about 70 degrees. The common axis 115 of the collection section 110 can be directed toward the zenith for a rooftop mounted collector, and can be directed toward the horizontal for a building side mounted collector. The tilt angle θ used can depend upon the placement of the concentrating daylight collector 100, including, for example, latitude, unobstructed view, duration and times for optimum daylighting, and the like, as described elsewhere. A plurality of moveable reflective vanes 120 are disposed adjacent the first opening 114, and are used for directing the received sunlight into the concentration section 134. Each of the plurality of moveable reflective vanes 120 are parallel to adjacent vanes, and each includes a vane axis 125 about which each moveable reflective vane 120 rotates. In some cases, each vane axis 125 can be located in the middle of each moveable reflective vane 120 as shown, or it can be located at one of the ends of each vane.

In some cases, the collection section 110 can move in a rotation direction 117 about the common axis 115, and the concentration section 134 can remain stationary. In some cases, both the collection section 110 and the concentration section can rotate together about the common axis 115.

Concentration section 134 includes a parabolic reflector 130 having a common focal point 136 between the parabolic reflector 130 and a hyperbolic reflector 140. The hyperbolic reflector 140 includes a second focal point 137 located near an output aperture 150. The output aperture 150 is a hole positioned in the parabolic reflector 130, generally along the common axis 115. In some cases, the output aperture 150 can be a hole positioned in the parabolic reflector 130 at a position removed from the common axis 115, which can be effected by changing the relative focal point positions of the hyperbolic reflector 140 as can be readily determined by one of skill in the art. Light rays entering parallel to the common axis 115 are reflected from the parabolic reflector 130 and directed toward the common focal point 136. In a similar manner, light rays directed toward the common focal point 136 are reflected from the hyperbolic reflector 140 and directed toward the second focal point 137, as known to one of skill in the art.

A pair of light rays will now be traced through the concentrating daylight collector 100. A first pair of light rays 160a, 160b, oriented at an angle φ1 to the common axis 115 is directed toward the first opening 114 and reflects from a first and a second reflective vane 121, 122, respectively. First and second reflective vanes 121, 122 are oriented at a first vane angle δ1 to the common axis 115 of the collection section 110, such that first pair of light rays 160a, 160b, becomes first reflected pair of light rays 161a, 161b. First reflected pair of light rays 161a, 161b enters concentration section 134 in a direction parallel to the common axis 115, and is reflected from parabolic reflector 130 toward the common focal point 136 as second reflected pair of light rays 162a, 162b. Second reflected pair of light rays 162a, 162b then reflect from hyperbolic reflector 140 and are directed toward second focal point 137, where they exit output aperture 150 as output concentrated sunlight 170 having a collimation half-angle of α degrees.

Relatively well-collimated light can be more effectively used in mirror-lined duct systems for transporting light. As the sunlight is concentrated, the collimation angle will increase from the input collimation angle of sunlight, about ½ degree. Generally, the collimation half-angle α of concentrated sunlight passing through the output aperture 150 should be restricted to no greater than about 30 degrees, or no greater than about 25 degrees, or no greater than about 20 degrees. In one particular embodiment, the collimation angle α can be about 23 degrees. The accuracy of tracking the sun, as well as the accuracy of the various optical components (e.g., flatness and placement of reflective vanes, parabolic reflector shape, and hyperbolic reflector shape) all contributes to the resulting collimation angle α. For example, the accuracy of rotation 117, tilt angle θ, vane tilt angle δ1, and azimuth angle of the sun φ1, can affect both the concentration ratio of input light area to output light area and output collimation half-angle α.

Figure 1B:
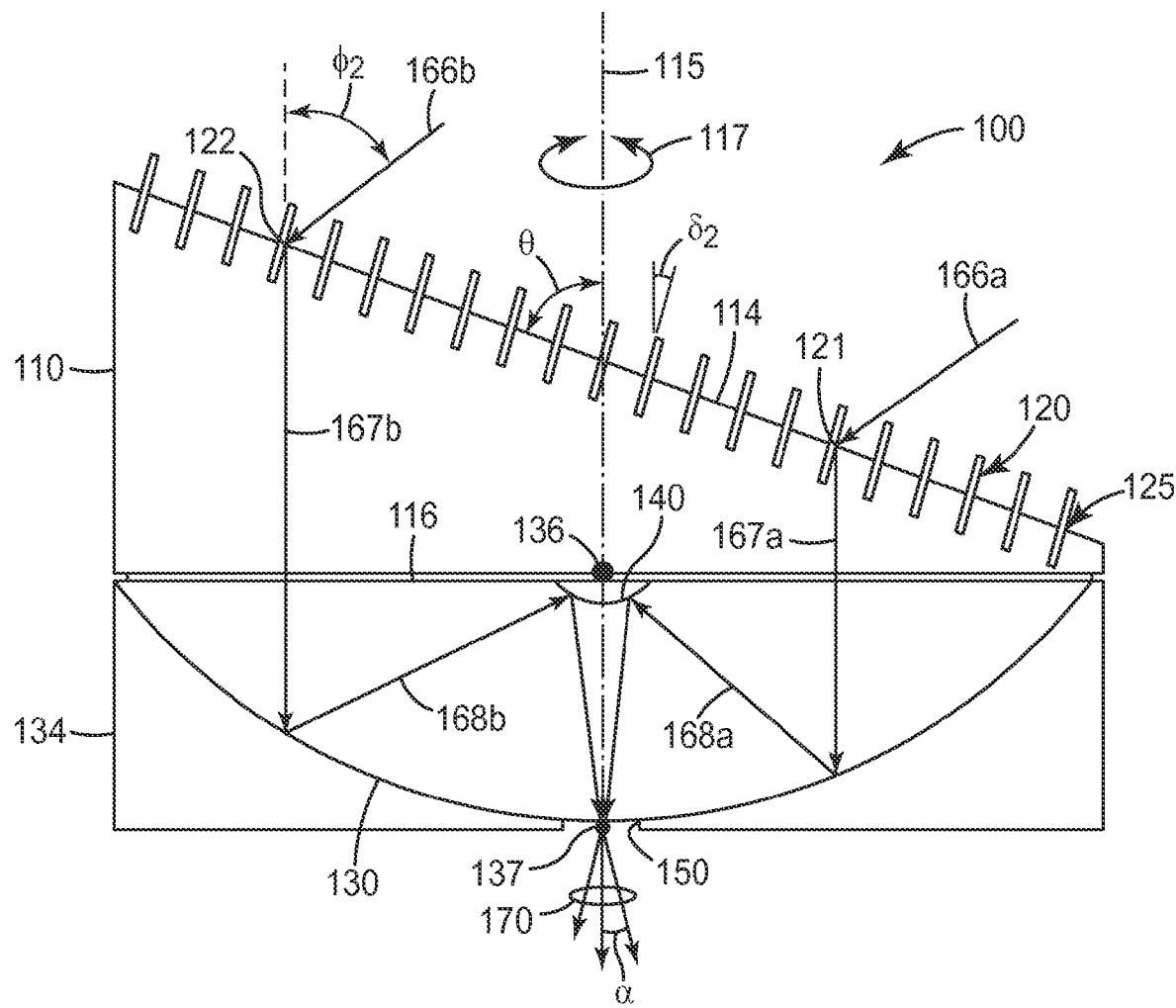
FIG. 1B shows a cross-section schematic of a concentrating daylight collector.

FIG. 1B shows a cross-section schematic of the concentrating daylight collector 100 of FIG. 1A at a different solar azimuth angle φ2, according to one aspect of the disclosure. FIGS. 1A and 1B together demonstrate that by using a combination of rotation about the common axis and vane tilt angle, different solar positions can be accommodated so that the concentrating daylight collector 100 can collect and concentrate sunlight. For brevity, each of the elements 110-170 shown in FIG. 1B correspond to like-numbered elements 110-170 shown in FIG. 1A, which have been described previously. For example, common axis 115 of FIG. 1B corresponds to common axis 115 of FIG. 1A, and so on.

A second pair of light rays 166a, 166b, will now be traced through the concentrating daylight collector 100. The second pair of light rays 166a, 166b, oriented at an angle φ2 to the common axis 115, is directed toward the first opening 114 and reflects from a first and a second reflective vane 121, 122, respectively. First and second reflective vanes 121, 122 are oriented at a second vane angle δ2 to the common axis 115 of the collection section 110, such that first pair of light rays 166a, 166b, becomes first reflected pair of light rays 167a, 167b. First reflected pair of light rays 167a, 167b enters concentration section 134 in a direction parallel to the common axis 115, and is reflected from parabolic reflector 130 toward the common focal point 136 as second reflected pair of light rays 168a, 168b. Second reflected pair of light rays 168a, 168b then reflect from hyperbolic reflector 140 and are directed toward second focal point 137, where they exit output aperture 150 as output concentrated sunlight 170 having a collimation half-angle of α degrees.

In a manner similar to the first pair of light rays 160a, 160b, described in FIG. 1A, the collimation half-angle α of FIG. 1B can vary based on several considerations. For example, the accuracy of rotation 117, tilt angle θ, vane tilt angle δ2, and azimuth angle of the sun φ2, can affect both the concentration ratio of input light area to output light area and output collimation half-angle α.

Figure 2:
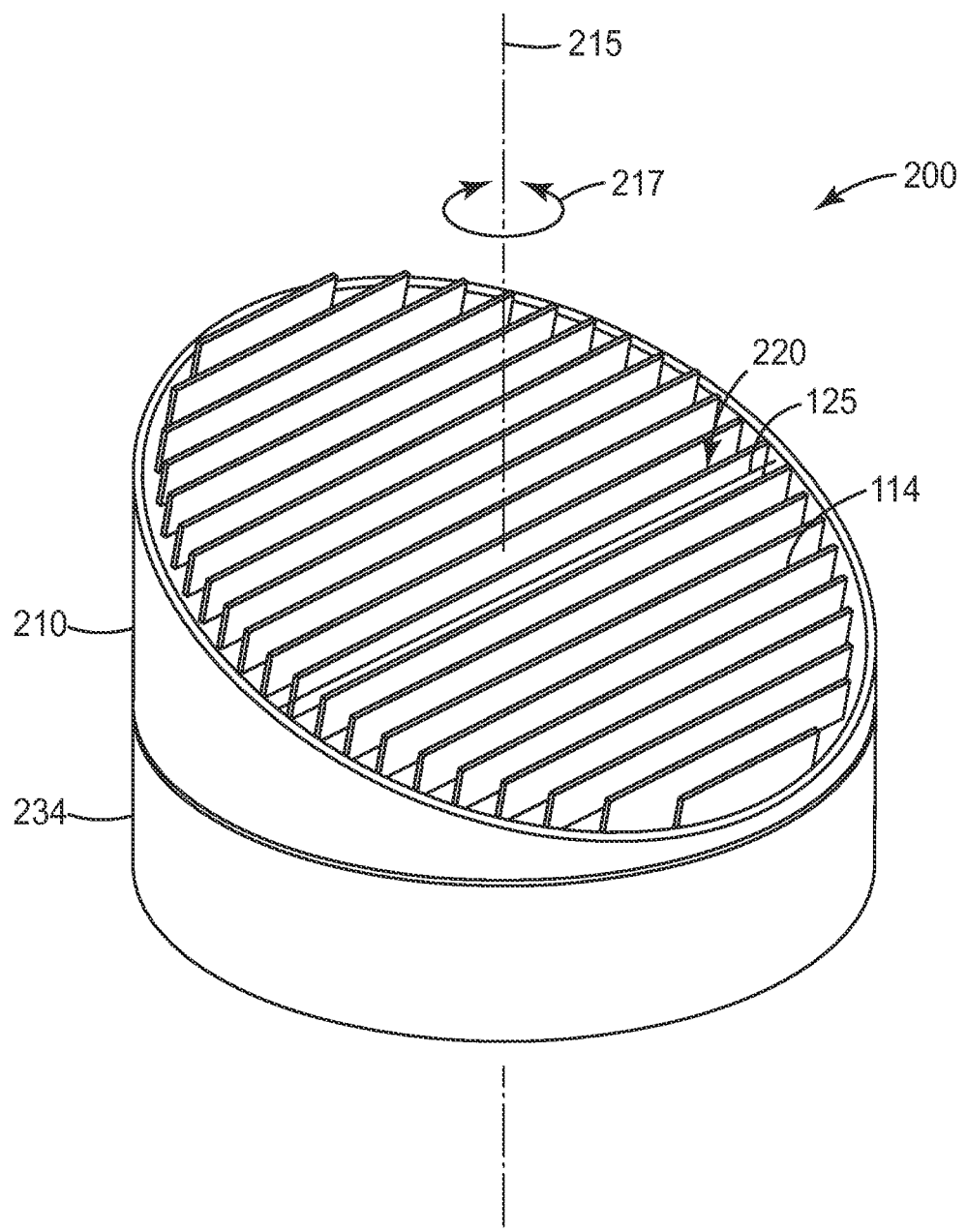
FIG. 2 shows a perspective-view schematic of a concentrating daylight collector.

FIG. 2 shows a perspective-view schematic of a concentrating daylight collector 200, according to one aspect of the disclosure. In FIG. 2, collector housing 210 is a cylindrical-shaped housing that is placed adjacent the concentrator section 234, and shares a common axis 215 which can rotated in rotation direction 217 to track the solar position. The plurality of reflective vanes 220 disposed in the first opening 114 are parallel to one another, and each includes a vane axis 125 about which they can rotate. In one particular embodiment, the collector housing 210 can be a transparent cylindrical housing that includes the first opening 114 and also includes a top and sides (not shown) that can protect the reflective vanes 220 from the environment.

A substantial increase in the collectable illuminance is realized by tilting the rotating mirror array relative to the basal plane of the collector. Here the mirror array is affixed to a scooped cylinder which rotates relative to a stationary cylindrical base which is flush mounted on the south-facing sidewall or rooftop of a building. The scooped cylinder is rotated so that the long axes of the slats are normal to the plane containing the inward normal to the basal plane (i.e., the cylindrical axis of the base) and the direction to the sun. The slats are then tilted so that the normal to each slat bisects these two directions. With the slats so oriented, a single specular reflection will redirect the incident sunlight inward normal to the basal plane.

Figure 3:
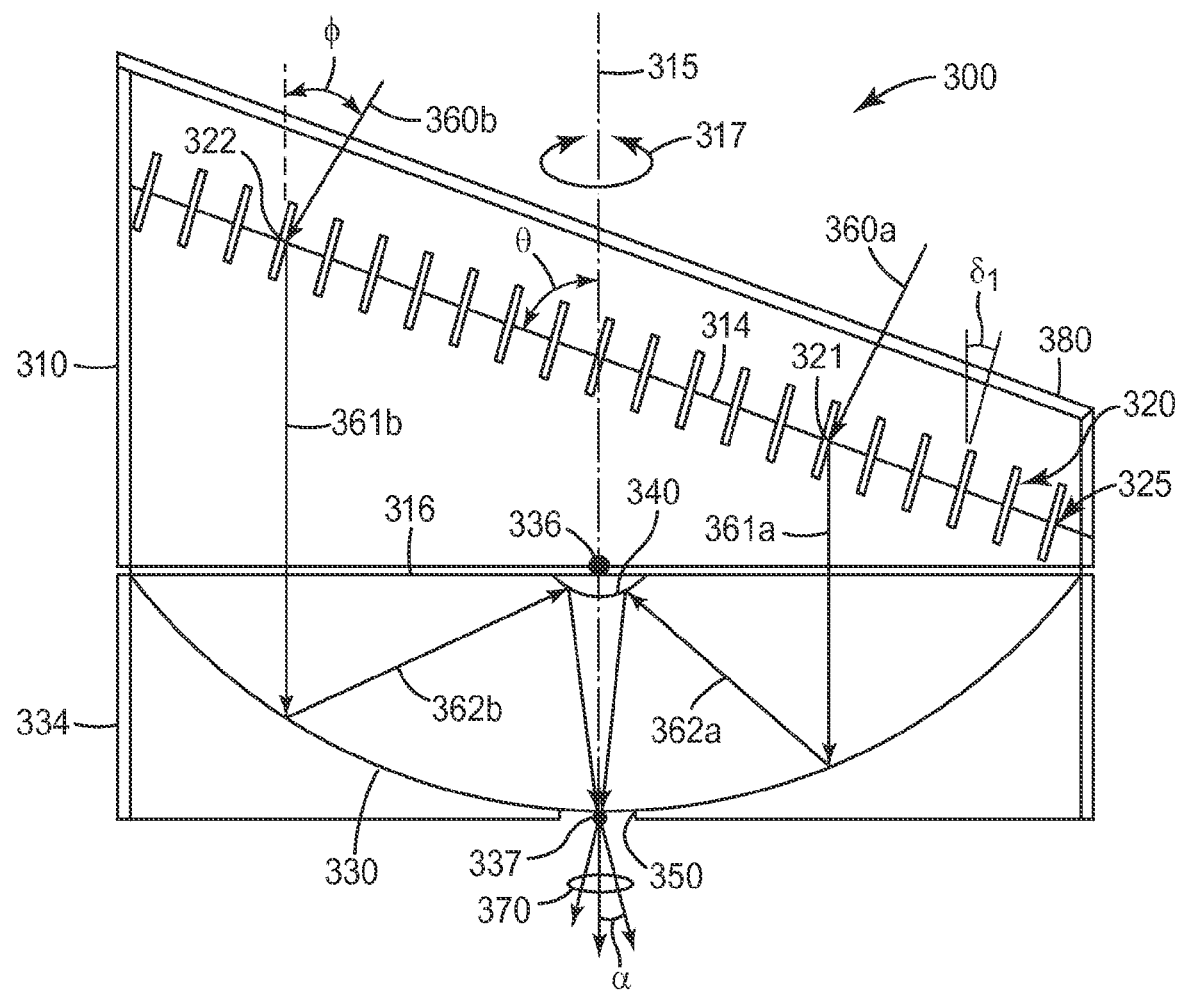
FIG. 3 shows a cross-section schematic of a concentrating daylight collector.

FIG. 3 shows a cross-section schematic of a concentrating daylight collector 300 having a planar protective cover 380 which can protect the optical components from the elements, according to one aspect of the disclosure. For brevity, each of the elements 310-370 shown in FIG. 3 correspond to like-numbered elements 110-170 shown in FIG. 1A, which have been described previously. For example, common axis 315 of FIG. 3 corresponds to common axis 115 of FIG. 1A, pair of light rays 360a, 360b travel through daylight collector 300 in a manner similar as pair of light rays 160a, 160b travel through daylight collector 100, and so on.

Figure 4A:
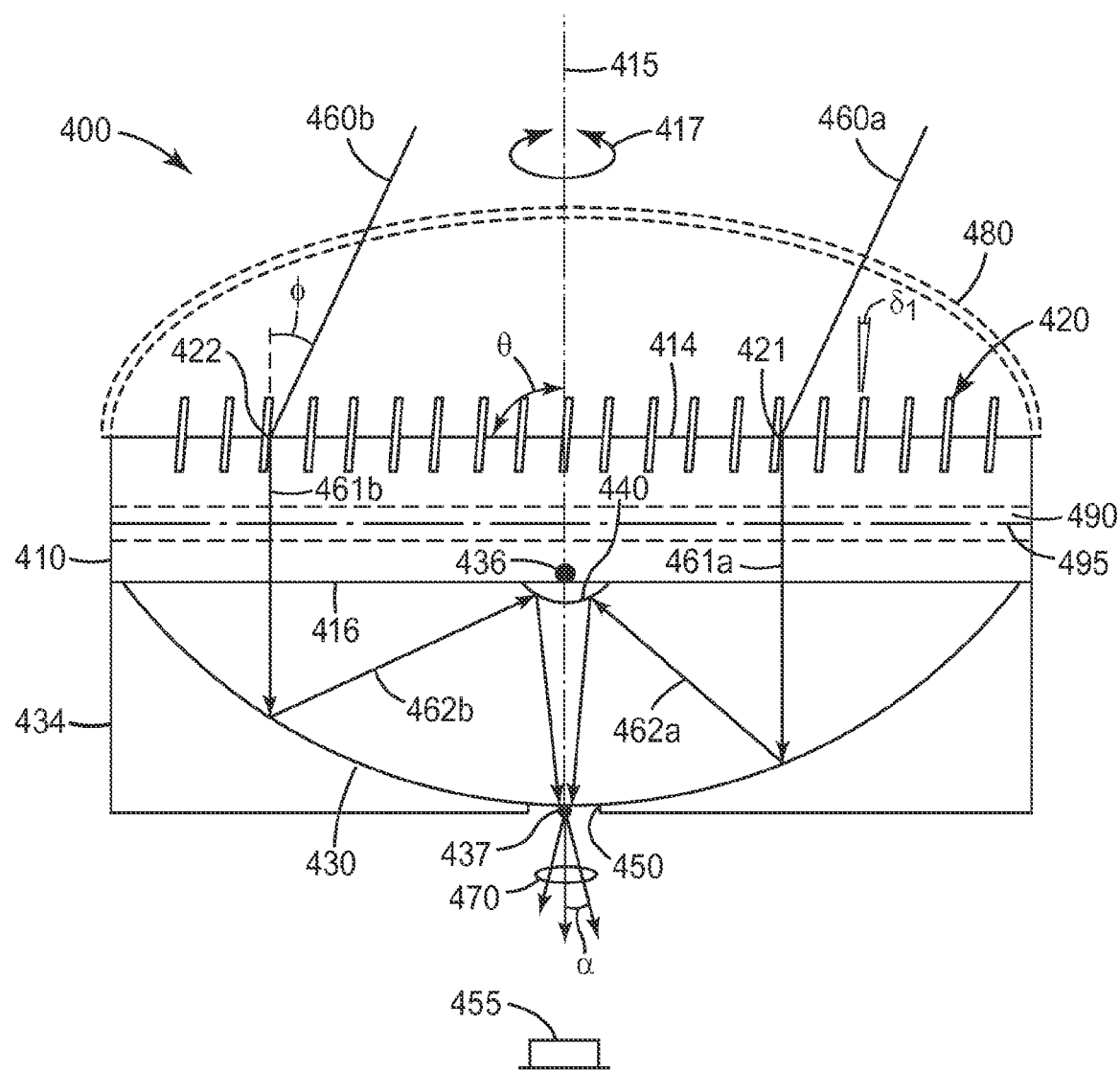
FIG. 4A shows a cross-section schematic of a concentrating daylight collector.

FIG. 4A shows a cross-section schematic of a concentrating daylight collector 400 having an optional curved protective cover 480 which can protect the optical components from the elements, according to one aspect of the disclosure. For brevity, each of the elements 410-470 shown in FIG. 4A correspond to like-numbered elements 110-170 shown in FIG. 1A, which have been described previously. For example, common axis 415 of FIG. 4A corresponds to common axis 115 of FIG. 1A, pair of light rays 460a, 460b travel through daylight collector 400 in a manner similar as pair of light rays 160a, 160b travel through daylight collector 100, and so on. In one particular embodiment, the first opening 414 as shown in FIG. 4A forms an angle θ that is 90 degrees with the common axis of rotation 415.

Concentrating daylight collector 400 can further include a second plurality of reflective vanes 490 disposed between the plurality of reflective vanes 420 and the output area 416. The second plurality of reflective vanes 490 can be positioned orthogonal to the plurality of reflective vanes 420 as shown in FIG. 4A, or they can be disposed at some other angle as desired. The second plurality of reflective vanes 490 can each be parallel to an adjacent vane, and each can rotate about a vane axis 495 in a manner similar to the plurality of reflective vanes 420.

In some cases, the addition of the second plurality of reflective vanes can make the concentrating daylight collector 400 less susceptible to errors in rotational tracking, and can in some cases replace rotational tracking altogether. In one particular embodiment, light from any spatial input angle (requiring two variables to define) can be directed to be parallel to axis 415 after striking both mirror arrays. In this embodiment, only two inputs can be required to track the sun, i.e., one for adjusting the angle of plurality of reflective vanes 420 and one adjusting the angle of second plurality of reflective vanes 490. Further in this embodiment, the path of first reflected pair of light rays 461a, 461b includes an additional reflection from the plurality of second reflective vanes 490 before entering the concentrator section 434.

The concentrated sunlight 470 can be directed toward an energy conversion device 455 such as a photovoltaic device or a thermal conversion device, or directed into a mirror-lined duct as described elsewhere. In some cases, the energy conversion device 455 can instead be located at the position of hyperbolic reflector 440, since such energy conversion devices often do not require collimated light to function efficiently.

Figure 4B:
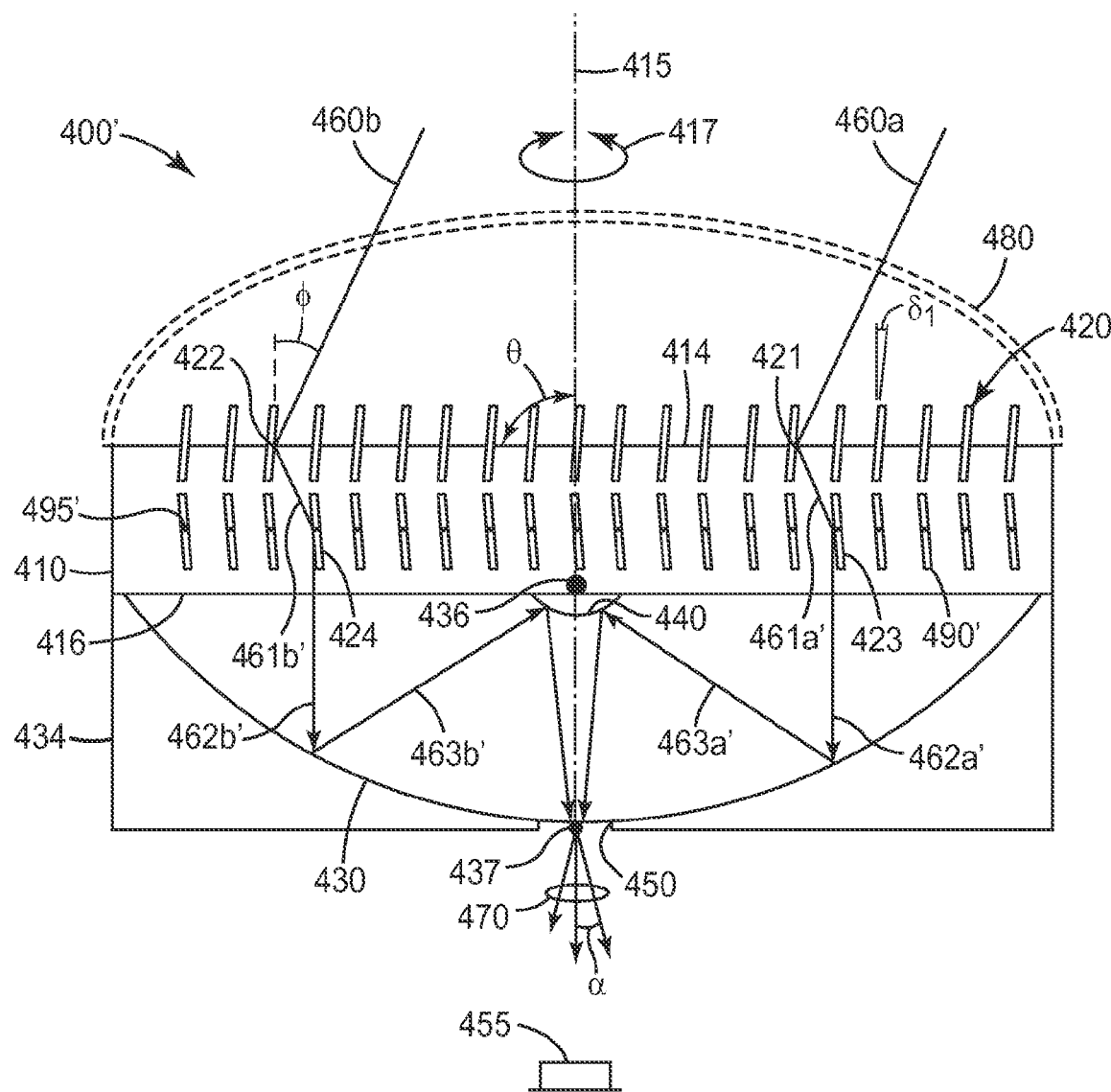
FIG. 4B shows a cross-section schematic of a concentrating daylight collector.

FIG. 4B shows a cross-section schematic of a concentrating daylight collector 400' having an optional curved protective cover 480 which can protect the optical components from the elements, according to one aspect of the disclosure. For brevity, each of the elements 410-470 shown in FIG. 4B correspond to like-numbered elements 110-170 shown in FIG. 1A, which have been described previously. For example, common axis 415 of FIG. 4B corresponds to common axis 115 of FIG. 1A, and so on. In one particular embodiment, the first opening 414 as shown in FIG. 4B forms an angle θ that is 90 degrees with the common axis 415.

Concentrating daylight collector 400' can further include a second plurality of reflective vanes 490' disposed between the plurality of reflective vanes 420 and the output area 416. The second plurality of reflective vanes 490' can be positioned parallel to the plurality of reflective vanes 420 as shown in FIG. 4B, or they can be disposed at some other angle as desired. The second plurality of reflective vanes 490' can each be parallel to an adjacent vane, and each rotates about a vane axis 495' in a manner similar to the plurality of reflective vanes 420.

In some cases, the addition of the second plurality of reflective vanes can make the concentrating daylight collector 400' less susceptible to errors in rotational tracking, and can in some cases replace rotational tracking altogether. In one particular embodiment, light from any spatial input angle (requiring two variables to define) can be directed to be parallel to axis 415 after striking both mirror arrays. In this embodiment, only two inputs can be required to track the sun, i.e., one for adjusting the angle of plurality of reflective vanes 420 and one adjusting the angle of second plurality of reflective vanes 490'. In some cases, the second plurality of reflective vanes 490' can instead have a fixed position, and the rotation of housing 410 and plurality of vanes 420 can be sufficient to direct light parallel to axis 415, as known to one of skill in the art.

A pair of light rays will now be traced through the concentrating daylight collector 400'. A first pair of light rays 460a, 460b, oriented at an angle φ to the common axis 415 is directed toward the first opening 414 and reflects from a first and a second reflective vane 421, 422, respectively. First and second reflective vanes 421, 422 are oriented at a first vane angle δ1 to the common axis 415 of the collection section 410, such that first pair of light rays 460a, 460b, becomes first reflected pair of light rays 461a', 461b'. First reflected pair of light rays 461a', 461b' reflects from a third and a fourth reflective vane 423, 424, respectively, and become second reflected pair of light rays 462a', 462b'.

Second reflected pair of light rays 462a', 462b' enters concentration section 434 in a direction parallel to the common axis 415, and is reflected from parabolic reflector 430 toward the common focal point 436 as third reflected pair of light rays 463a', 463b', respectively. Third reflected pair of light rays 463a', 463b' then reflect from hyperbolic reflector 440 and are directed toward second focal point 437, where they exit output aperture 450 as output concentrated sunlight 470 having a collimation half-angle of α degrees.

The concentrated sunlight 470 can be directed toward an energy conversion device 455 such as a photovoltaic device or a thermal conversion device, or directed into a mirror-lined duct as described elsewhere. In some cases, the energy conversion device 455 can instead be located at the position of hyperbolic reflector 440, since such energy conversion devices often do not require collimated light to function efficiently.

Figure 5:
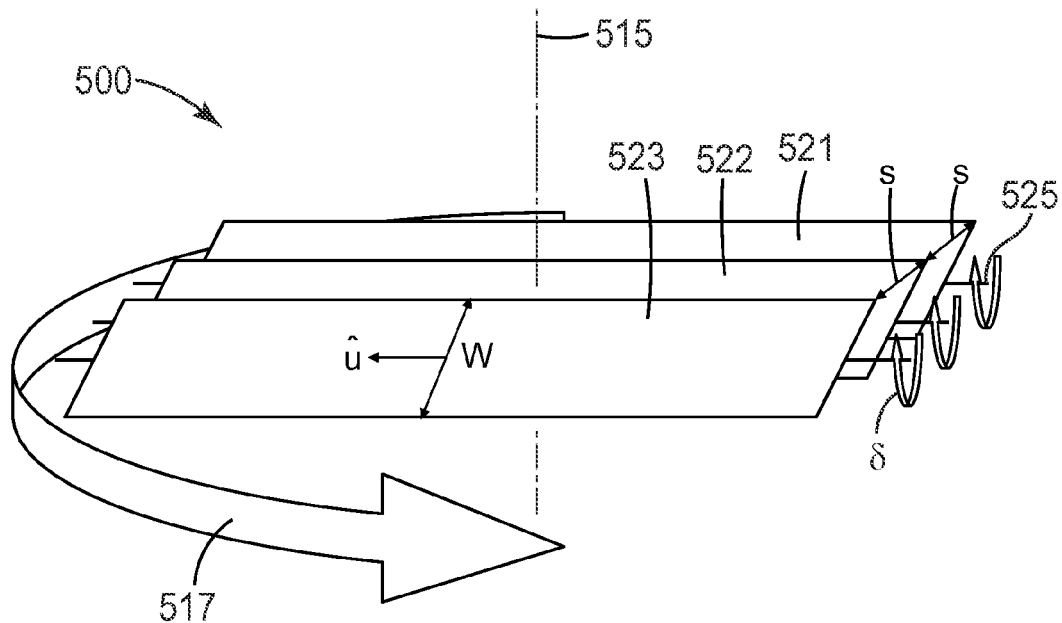
FIG. 5 shows a perspective-view schematic of a daylight collector array.

A concentrating daylight collector was modeled, to demonstrate the performance at selected latitudes and orientations. FIG. 5 shows a daylight collector array 500, according to one aspect of the disclosure. The collector array 500 includes a series of parallel mirror-lined slats 521, 522, 523, of width W and spacing s with coplanar rotational axes 525 parallel to the long axis of the slats. They are fixtured (using, for example, a rod connecting the slats together) so that the motion of a single servo will produce rotations to identically tilt every slat in the array. A second servo rotates 517 the entire array about an axis 515 normal to the plane of the array (i.e., normal to the plane containing the rotational axes of the slats). In this manner, it is possible to achieve any orientation of the vector normal û to the slats with an appropriate combination of two servo motions.

Figure 6:
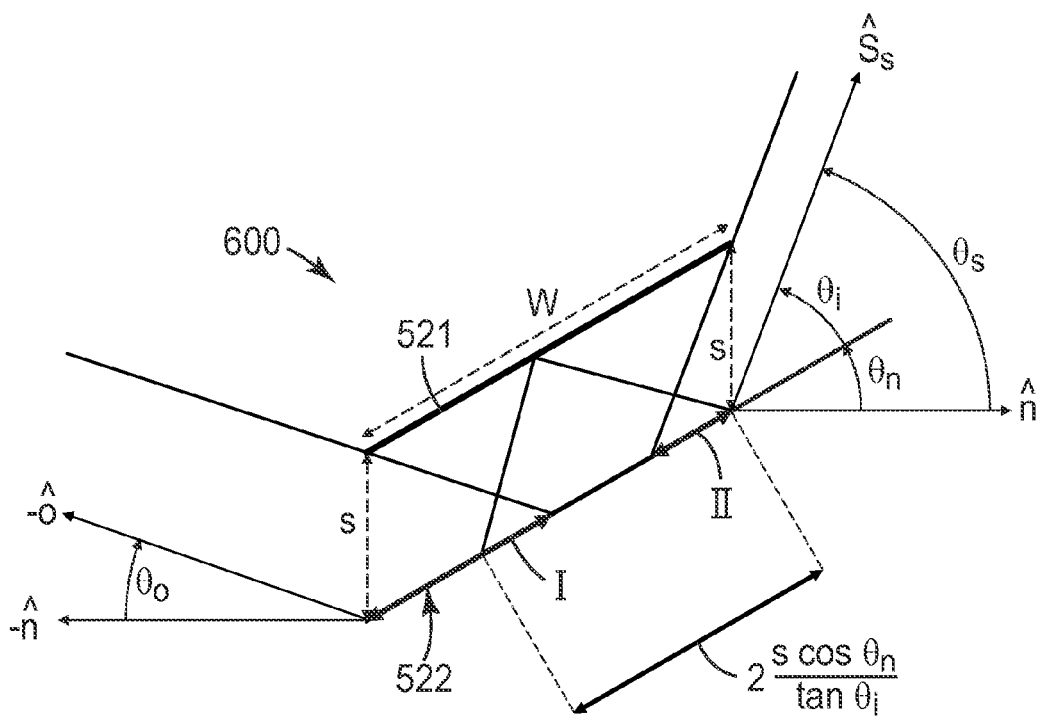
FIG. 6 shows a schematic view of daylight collector vanes.

Generally, not all of the solar flux incident upon the mirror array will contribute to flux useable by the concentrator. The efficiency of the collector array 500 can be defined as the ratio of the useable flux to the incident flux. FIG. 6 shows a schematic view of daylight collector vanes 600, according to one aspect of the disclosure. In FIG. 6, neighboring vanes (i.e., slats) 521, 522 are shown within the plane containing the inward normal to the basal plane (−ô) and the direction to the sun ($\hat{s}_s$) after the mirror array has been rotated so that û is normal to this plane. The direction (n̂) shown in FIG. 6 corresponds to the normal to the plane of rotation, such as axis 515 in FIG. 5. The slats are tilted so that incidence from $\hat{s}_s$ is redirected toward −ô. The necessary tilt is $\theta_n = (\theta_s - \theta_o)/2$, and the angle of incidence and reflection for this tilt is $\theta_i = (\theta_s + \theta_o)/2$. The incidence illuminates the plane containing the bottom slat a distance $s \cos\theta_s / |\sin\theta_i|$ inward from the illuminated edge (Region I). An observer along −ô directly views the same plane to a distance $s \cos\theta_o / |\sin\theta_i|$ inward from the opposing edge (Region II). A pair of specular bounces translates a ray a distance $2s \cos\theta_n / |\tan\theta_i|$ along the bottom slat with no net change in its direction of propagation.

Light transmitted in the direction −ô leaves the bottom slat 522 from Region II, having arrived there either in Region I (single-bounce transmission), or Region I translated $2s \cos\theta_n / |\tan\theta_i|$ along the bottom slat 522 (triple-bounce transmission), or Region I translated $4s \cos\theta_n / |\tan\theta_i|$ (five-bounce transmission), and so on. The efficiency (assuming 100-percent reflective mirrors) is the overlap of the sum of the bounces from Region I with Region II, divided by the width of a single Region I, and can be represented by the equation below:

$$\varepsilon_{mirror} = \sum_{n=0} \frac{\min\left(\frac{W}{s}, 2n\frac{\cos\theta_n}{|\tan\theta_i|} + \frac{\cos\theta}{|\sin\theta_i|}\right), \max\left(0, \frac{W}{s} - \frac{\cos\theta_o}{|\sin\theta_i|}\right), \frac{W}{s}\right]}{\frac{\cos\theta_s}{|\sin\theta_i|}}$$

$$Ov\left[\min\left(\frac{W}{s}, 2n\frac{\cos\theta_n}{|\tan\theta_i|}\right),\right.$$

where $Ov[x_1, x_2, x_3, x_4] \equiv \max(0, \min(x_2, x_4) - \max(x_1, x_3))$ denotes the overlap of the line segments $x_1 \to x_2$ and $x_3 \to x_4$.

To evaluate the useable flux available to the concentrator, the annual daytime average of the cosine of the angle of the sun relative to the outward normal to the array was weighted by the efficiency of the array from the above equation. Evaluation of the efficiency requires specification of the width-to-spacing ratio of the mirrors. There are many conceivable schemes for this specification beyond a simple fixed value. For example, the width-to-spacing ratio might increase with increasing angle relative to the array normal by means of telescoping slats that have variable widths (W). Whatever scheme is selected, the efficiency is equal to one when $\cos\theta_s < \cos\theta_o$, and the efficiency is equal to $\cos\theta_o / \cos\theta_s$ when $\cos\theta_s > \cos\theta_o$. "Entitlement" performance is characterized by this value of the efficiency for each value of the abscissa. Values for both south-side mount and rooftop collectors at 30, 45, and 60-degrees latitude are summarized in Table 1.

A mirror array with a fixed value of W/s cannot turn every direction of solar incidence toward the inward normal to the basal plane with unit efficiency. To determine the best compromise fixed value, trial values were selected and the annual daytime average values of $\cos\theta_{inc} \times \varepsilon_{mirrors}$ were evaluated, resulting in a rooftop collector for a 45-degrees latitude location having W/s=1.6 as the best compromise fixed value. While W/s=1.6 is not the precise optimum for both side-mount and rooftop collectors at 30, 45, and 60-degrees latitude, it suffices as a compromise which is near-optimal for all of these cases. The annual daytime average values of $\cos\theta_{inc} \times \varepsilon_{mirrors}$ for W/s=1.6 are summarized in the third row of Table 1.

Infinitely-telescoping slats (or, alternatively, slats having an adjustable spacing "s") would be necessary to realize the "Entitlement" performance shown in Table 1. Such slats are difficult to design in practice; however, it is reasonable to envision slats which telescope to perhaps 1.5 times their fully-collapsed width. In some cases, slats that have some ability to adjust their spacing are also possible. The evaluation of the annual daytime average value of $\cos\theta_{inc} \times \varepsilon_{mirrors}$ for a rooftop collector at 30, 45, and 60-degrees latitude, having slats which are capable of telescoping between values of W/s=1.6 and W/s=2.4 are summarized in the fourth row of Table 1.

A two-tiered mirror array such as shown in FIG. 4B has also been modeled, i.e., the axis of rotation of the two tiers of slats are parallel. The two-tiered mirror array includes an outer member (i.e., plurality of reflective vanes 420) that steers light toward an intermediate direction, and an inner member (i.e., second plurality of reflective vanes 490) that steers it back toward the desired transmitted direction. The intermediate direction is selected so as to increase the individual efficiencies of both arrays. Several configurations have been modeled, and are well represented by the specific case of (1) a W/s=3.0 outer array which steers incidence arriving within 23 degrees of the array normal ($|\theta_s| < 23°$) away from the desired transmitted direction ($\theta_o = -20°$) toward the direction $\theta'_o$ specified by:

$$\frac{W}{s} = 3.0 = \frac{\cos\theta_s}{\sin\left(\frac{(\theta'_o + \theta_s)}{2}\right)}$$

which ensures maximal efficiency of the outer array, and (2) a W/s=1.4 inner array which steers the intermediate direction $\theta'_o$ back toward $\theta_o$=−20°. The slats of the outer array are turned parallel to the direction of solar incidence for $|\theta_s|>23°$ and the steering toward $\theta_o$=−20° is accomplished entirely by the inner array. Values for side-mount and rooftop collectors at 30, 45, and 60-degrees latitude are summarized in the final row of Table 1.

TABLE 1

| Tilt angle of plurality of vanes | South Side Mount (Northern Latitude) | | | Rooftop Mount (Latitude) | | |
|---|---|---|---|---|---|---|
| (90-θ shown in FIGS. 1A, 1B, 3) | 30 deg | 45 deg | 60 deg | 30 deg | 45 deg | 60 deg |
| 0 degree Tilt; Entitlement | 0.31 | 0.41 | 0.47 | 0.54 | 0.45 | 0.35 |
| 20 degree Tilt; Entitlement | 0.56 | 0.65 | 0.66 | 0.80 | 0.75 | 0.67 |
| 20 degree Tilt; (W/s) = 1.6 | 0.46 | 0.50 | 0.45 | 0.56 | 0.58 | 0.55 |
| 20 degree Tilt; 1.6 < (W/s) < 2.4 | 0.52 | 0.58 | 0.54 | 0.67 | 0.66 | 0.61 |
| Two parallel vane tiers as in FIG. 4B 20 degree Tilt (W/s)$_{inner}$ = 1.4 (W/s)$_{outer}$ = 3.0 Θ$_0$ = 23 degrees | 0.47 | 0.53 | 0.51 | 0.63 | 0.62 | 0.58 |

Comparison of the rows in Table 1 generally shows that (a) tilting the array by as little as 20 degrees increases the useable flux; (b) even the simplest of mirror arrays preserves much of the gains associated with tilt, enough so that actual values for the tilted array exceed "entitlement" for an untilted array; (c) complex array designs can exhibit gains, such as shown for the two parallel vane tiers; however these gains should be justified over the advantages of a simpler design. The annual daytime average useable flux provided to the concentrator section (assuming perpetual sunny conditions) is equal to the solar flux (approximately $10^5$ Lm/m$^2$) times the area of the footprint of the collector, times the value provided in Table 1. In general, for a simple W/s=1.6 array on a 20-degree tilt (i.e., θ=70 degrees), the annual daytime average useable flux provided to the concentrator by this array in a 1.5-meter diameter scooped-cylinder collector will be approximately 88,000 Lm for both south side mount and rooftop collectors, at 30, 45, or 60-degrees latitude.

In one particular embodiment, as described elsewhere, the concentrator section includes a large parabolic mirror and a small hyperbolic mirror. The focus of the paraboloid resides at the center of the top surface of the base, and the diameter of the paraboloid is equal to the inner diameter of the base. Thus the depth of the paraboloid is one-quarter the inner diameter of the base, and the maximum slope of its surface is 45 degrees. The paraboloid possesses a circular exit aperture about its vertex whose area relative to the footprint of the base specifies the concentration ratio of the collector.

The first focus of the hyperboloid is coincident with the focus of the paraboloid, the second focus resides at the center of the exit aperture, and the diameter of the hyperboloid within the plane of the top surface of the base is equal to the diameter of the exit aperture. This configuration of mirrors is that of a Cassegrain telescope, and the fundamental optical functioning is the same as that of these telescopes.

For perfectly-collimated and exactly downward incidence from the mirror array, all of the light crossing the top surface of the base between the radius of the hyperbolic mirror and the radius of the base will be focused upon the center of the exit aperture. In a telescope, very-small deviations in the direction of incidence map in an orderly fashion to small deviations in the focus within the exit aperture. For the present concentrator, whatever deviations are present in the incidence from the solar disc result in displacements at the exit aperture that are less than the radius of this aperture. The implications of this relaxed requirement are substantial relaxation of the precision required in the fabrication and placement of the optical elements.

The half angle of the solar subtense is approximately ¼ degree. The half angle of collimation transmitted by the mirror array will also be ¼ degree if the slats in the array are perfectly flat and perfectly aligned, and the centroid of this transmitted brightness will be exactly downward if the slats are exactly tilted at the angle prescribed by the position of the sun. Imprecision in any of these factors can result in an increase in the half angle of the downward-directed transmitted brightness. For a concentration ratio of about 100, the half angle of the brightness transmitted by the mirror array can be maintained at approximately ½-to-1 degree in order to maintain collector efficiency of about 90 percent.

Manufactured mirrors might exhibit a variety of distortions relative to their ideal parabolic or hyperbolic forms. The magnitude and nature of these distortions will depend upon the materials and methods of manufacturing used. The impact of parabolic distortion will be less for lower concentration ratios and an inability to thermoform (or otherwise fabricate) to this precision will necessitate reduction of the targeted concentration ratio. Reduced concentration would require either smaller collector footprints (i.e., fewer lumens collected) or larger exit apertures (i.e., larger light-distribution ducts).

Following are a list of embodiments of the present disclosure.

Item 1 is a concentrating daylight collector, comprising: a collection section having a first opening for receiving sunlight and an opposing second opening for transmission of sunlight; a plurality of moveable reflective vanes disposed adjacent the first opening for directing received sunlight to the opposing second opening; a parabolic reflector disposed to reflect a major portion of the sunlight passing though the opposing second opening to a hyperbolic reflector disposed adjacent a focal point of the parabolic reflector; and an output aperture disposed to accept sunlight reflected from the hyperbolic reflector.

Item 2 is the concentrating daylight collector of item 1, wherein the collection section comprises a cylinder.

Item 3 is the concentrating daylight collector of item 1 or item 2, wherein at least one of the collection section and the parabolic reflector rotate around a common axis.

Item 4 is the concentrating daylight collector of items 1 to 3, wherein the collection section rotates around a common axis and the parabolic reflector is stationary.

Item 5 is the concentrating daylight collector of items 1 to 4, wherein the first opening intersects a central axis of the collection section at an angle less than 90 degrees.

Item 6 is the concentrating daylight collector of item 5, wherein the angle is between about 20 degrees and about 70 degrees.

Item 7 is the concentrating daylight collector of items 5 to 6, wherein the angle is 70 degrees.

Item 8 is the concentrating daylight collector of items 1 to 7, further comprising a protective cover at least partially enclosing the first opening.

Item 9 is the concentrating daylight collector of item 8, wherein the protective cover comprises an optically transparent material.

Item 10 is the concentrating daylight collector of items 8 to 9, wherein the protective cover comprises a planar surface or a domed surface.

Item 11 is the concentrating daylight collector of items 1 to 10, wherein the parabolic reflector and the hyperbolic reflector include a combined concentration ratio between about 2:1 and about 100:1.

Item 12 is the concentrating daylight collector of items 1 to 11, wherein the sunlight transmitted through the output aperture is at least partially collimated.

Item 13 is the concentrating daylight collector of items 1 to 12, wherein the sunlight transmitted through the output aperture includes a collimation half-angle of no greater than about 20 degrees.

Item 14 is the concentrating daylight collector of items 1 to 13, wherein each of the plurality of moveable reflective vanes includes a vane axis of rotation that is orthogonal to the central axis.

Item 15 is the concentrating daylight collector of items 1 to 14, wherein each of the plurality of moveable reflective vanes are parallel to an adjacent vane.

Item 16 is a concentrating daylight collector, comprising: a sunlight collection section configured to receive a first sunlight beam through an input region and direct a reflected second sunlight beam toward a first output region, the reflected second sunlight beam substantially parallel to a central axis of the sunlight collection section; and a sunlight concentration section disposed adjacent the first output region and configured to receive the reflected second sunlight beam, reflect from a first concentrator surface, and reflect from a second concentrator surface, thereby forming a concentrated sunlight beam directed to an output aperture that is smaller than the first output region.

Item 17 is the concentrating daylight collector of item 16, wherein the sunlight collection section comprises a cylindrical shape.

Item 18 is the concentrating daylight collector of items 16 to 17, wherein the first concentrator surface comprises a reflective parabolic surface.

Item 19 is the concentrating daylight collector of items 16 to 18, wherein the second concentrator surface comprises a reflective hyperbolic surface.

Item 20 is the concentrating daylight collector of items 16 to 19, wherein the input region comprises a first plurality of moveable reflective vanes.

Item 21 is the concentrating daylight collector of item 20, wherein each of the first plurality of moveable reflective vanes includes a first vane axis of rotation that is orthogonal to the central axis.

Item 22 is the concentrating daylight collector of items 20 to 21, wherein each of the first plurality of moveable reflective vanes are parallel to an adjacent vane.

Item 23 is the concentrating daylight collector of items 16 to 22, wherein an angle between the input region and the central axis is in a range from about 20 degrees to about 60 degrees.

Item 24 is the concentrating daylight collector of items 16 to 23, wherein at least one of the sunlight collection section or the sunlight concentration section is capable of rotating about the central axis.

Item 25 is the concentrating daylight collector of items 16 to 24, wherein an areal ratio of the first output region to the output aperture is greater than about 10 and less than about 100.

Item 26 is the concentrating daylight collector of items 16 to 25, wherein the concentrated sunlight beam comprises a collimation half-angle of no greater than about 20 degrees.

Item 27 is the concentrating daylight collector of items 16 to 26, further comprising a protective cover at least partially enclosing the input region.

Item 28 is the concentrating daylight collector of items 16 to 27, further comprising a second plurality of moveable vanes disposed between the input region and the first output region.

Item 29 is the concentrating daylight collector of item 28, wherein each of the second plurality of moveable vanes includes a second vane axis of rotation orthogonal to the central axis and parallel to the first vane axis of rotation.

Item 30 is the concentrating collector of item 28, wherein each of the second plurality of moveable vanes includes a second vane axis of rotation orthogonal to the central axis and orthogonal to the first vane axis of rotation.

Item 31 is the concentrating daylight collector of items 1 to 30, wherein the sunlight from the output aperture is transmitted into an entrance aperture of a reflective duct.

Item 32 is the concentrating daylight collector of items 1 to 30, wherein the sunlight from the output aperture is transmitted onto a photovoltaic cell.

Item 33 is the concentrating daylight collector of items 1 to 30, wherein the sunlight from the output aperture is transmitted onto a thermal conversion device.

Item 34 is the concentrating daylight collector of item 31, wherein an artificial light source transmits into a second entrance aperture of a reflective duct.

Item 35 is the concentrating daylight collector of item 34, wherein the artificial light is programmable to maintain a uniform light flux in the duct.

Unless otherwise indicated, all numbers expressing feature sizes, amounts, and physical properties used in the specification and claims are to be understood as being modified by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A concentrating daylight collector, comprising:
   a collection section having a first opening for receiving sunlight and an opposing second opening for transmission of sunlight;
   a plurality of moveable reflective vanes disposed adjacent the first opening for directing received sunlight to the opposing second opening;

a parabolic reflector disposed to reflect a major portion of the sunlight passing though the opposing second opening to a hyperbolic reflector disposed adjacent a focal point of the parabolic reflector; and an output aperture disposed to accept sunlight reflected from the hyperbolic reflector.

2. The concentrating daylight collector of claim 1, wherein at least one of the collection section and the parabolic reflector rotate around a common axis.

3. The concentrating daylight collector of claim 1, wherein the first opening intersects a central axis of the collection section at an angle less than 90 degrees.

4. The concentrating daylight collector of claim 3, wherein the angle is between about 20 degrees and about 70 degrees.

5. The concentrating daylight collector of claim 3, wherein each of the plurality of moveable reflective vanes includes a vane axis of rotation that is orthogonal to the central axis.

6. The concentrating daylight collector of claim 1, wherein the parabolic reflector and the hyperbolic reflector include a combined concentration ratio between about 2:1 and about 100:1.

7. The concentrating daylight collector of claim 1, wherein the sunlight transmitted through the output aperture includes a collimation half-angle of no greater than about 20 degrees.

8. The concentrating daylight collector of claim 1, wherein each of the plurality of moveable reflective vanes are parallel to an adjacent vane.

9. A concentrating daylight collector, comprising:
a sunlight collection section configured to receive a first sunlight beam through an input region and direct a reflected second sunlight beam toward a first output region, the reflected second sunlight beam substantially parallel to a central axis of the sunlight collection section; and
a sunlight concentration section disposed adjacent the first output region and configured to receive the reflected second sunlight beam, reflect from a first concentrator surface, and reflect from a second concentrator surface, thereby forming a concentrated sunlight beam directed to an output aperture that is smaller than the first output region, wherein the input region comprises a first plurality of moveable reflective vanes.

10. The concentrating daylight collector of claim 9, wherein the first concentrator surface comprises a reflective parabolic surface.

11. The concentrating daylight collector of claim 9, wherein the second concentrator surface comprises a reflective hyperbolic surface.

12. The concentrating daylight collector of claim 9, wherein each of the first plurality of moveable reflective vanes includes a first vane axis of rotation that is orthogonal to the central axis.

13. The concentrating daylight collector of claim 9, wherein an angle between the input region and the central axis is in a range from about 20 degrees to about 60 degrees.

14. The concentrating daylight collector of claim 9, wherein at least one of the sunlight collection section or the sunlight concentration section is capable of rotating about the central axis.

15. The concentrating daylight collector of claim 9, wherein an areal ratio of the first output region to the output aperture is greater than about 10 and less than about 100.

16. The concentrating daylight collector of claim 9, wherein the concentrated sunlight beam comprises a collimation half-angle of no greater than about 20 degrees.

17. The concentrating daylight collector of claim 9, further comprising a second plurality of moveable vanes disposed between the input region and the first output region.

18. The concentrating daylight collector of claim 17, wherein each of the second plurality of moveable vanes includes a second vane axis of rotation orthogonal to the central axis and parallel to the first vane axis of rotation.

19. The concentrating collector of claim 17, wherein each of the second plurality of moveable vanes includes a second vane axis of rotation orthogonal to the central axis and orthogonal to the first vane axis of rotation.

20. The concentrating daylight collector of claim 1 or claim 9, wherein the sunlight from the output aperture is transmitted into an entrance aperture of a reflective duct.

* * * * *